(12) United States Patent
Jones et al.

(10) Patent No.: US 11,906,605 B1
(45) Date of Patent: Feb. 20, 2024

(54) APPARATUS, SYSTEMS, AND METHODS FOR MEASUREMENT USING MAGNETO-OPTICAL KERR EFFECT

(71) Applicant: The Government of the United States of America, as represented by the Secretary of the Navy, Arlington, VA (US)

(72) Inventors: Nicholas J. Jones, Fairfax, VA (US); Emily L. Guzas, North Kingston, RI (US); Matthew T. Roberts, West Bethesda, MD (US); Wayne C. Tucker, North Kingstown, RI (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 34 days.

(21) Appl. No.: 17/516,618

(22) Filed: Nov. 1, 2021

Related U.S. Application Data

(60) Provisional application No. 63/107,830, filed on Oct. 30, 2020.

(51) Int. Cl.
| | | |
|---|---|---|
| *G01R 33/12* | (2006.01) | |
| *G01R 33/032* | (2006.01) | |
| *G08B 21/18* | (2006.01) | |
| *G01R 33/07* | (2006.01) | |

(52) U.S. Cl.
CPC ..... *G01R 33/1223* (2013.01); *G01R 33/0325* (2013.01); *G01R 33/07* (2013.01); *G01R 33/1215* (2013.01); *G08B 21/182* (2013.01)

(58) Field of Classification Search
CPC ............ G01R 33/1223; G01R 33/0325; G01R 33/07; G01R 33/1215; G08B 21/182
See application file for complete search history.

(56) References Cited

U.S. PATENT DOCUMENTS

| 8,264,693 | B2 | 9/2012 | Stoica | |
|---|---|---|---|---|
| 8,941,377 | B2 | 1/2015 | Mizutani | |
| 9,348,000 | B1 | 5/2016 | Pressesky | |
| 10,892,196 | B2 | 1/2021 | Noh | |
| 11,474,169 | B2 | 10/2022 | Inami | |
| 2016/0133433 | A1* | 5/2016 | Fujita | H01J 37/18 250/492.3 |
| 2020/0249288 | A1* | 8/2020 | Inami | G01R 33/032 |
| 2021/0405086 | A1* | 12/2021 | te Velthuis | G01N 21/21 |

FOREIGN PATENT DOCUMENTS

| CN | 102252969 B | 2/2013 |
|---|---|---|
| GB | 2493811 A | 2/2013 |
| WO | WO2017018953 A1 | 2/2017 |

* cited by examiner

*Primary Examiner* — Alvaro E Fortich
(74) *Attorney, Agent, or Firm* — Dawn C. Russell; Jesus J. Hernandez

(57) ABSTRACT

The magneto-optical Kerr effect (MOKE) is used to capture variations in magnetic permeability and magnetization to determine the presence of sensitization. MOKE-magnetometry-based systems and apparatus may be used to provide in-field magnetic measurements, and may be particularly useful in methods for assessing changes in composition, crystal structure, and grain size in magnetic materials.

7 Claims, 10 Drawing Sheets

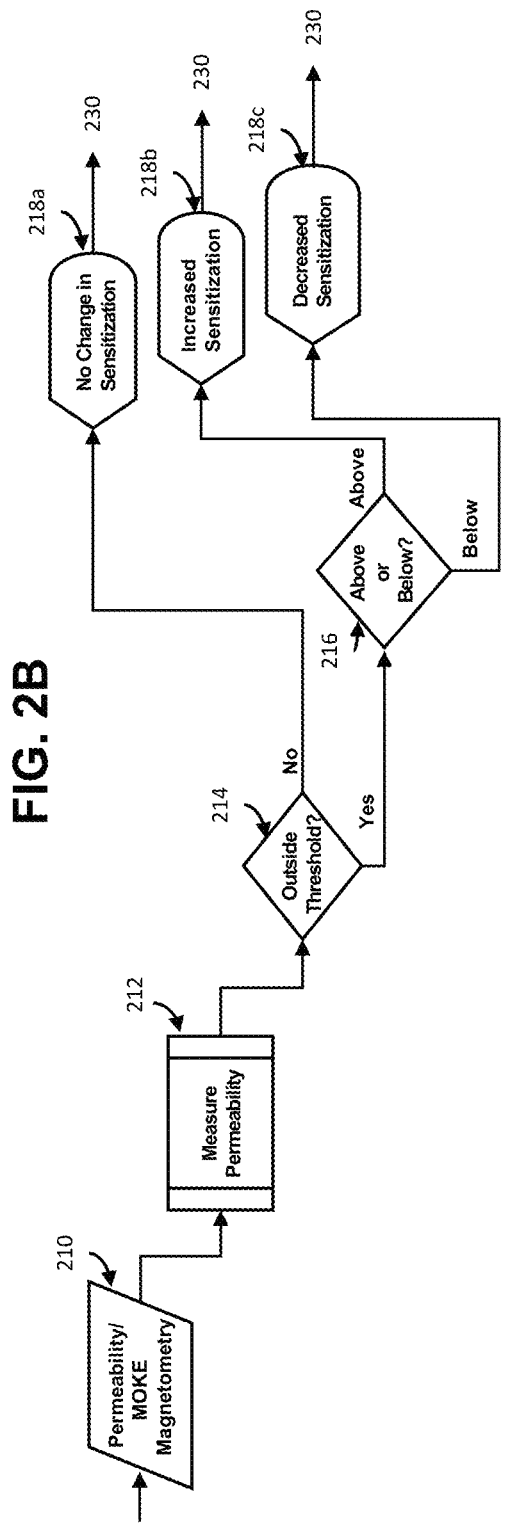

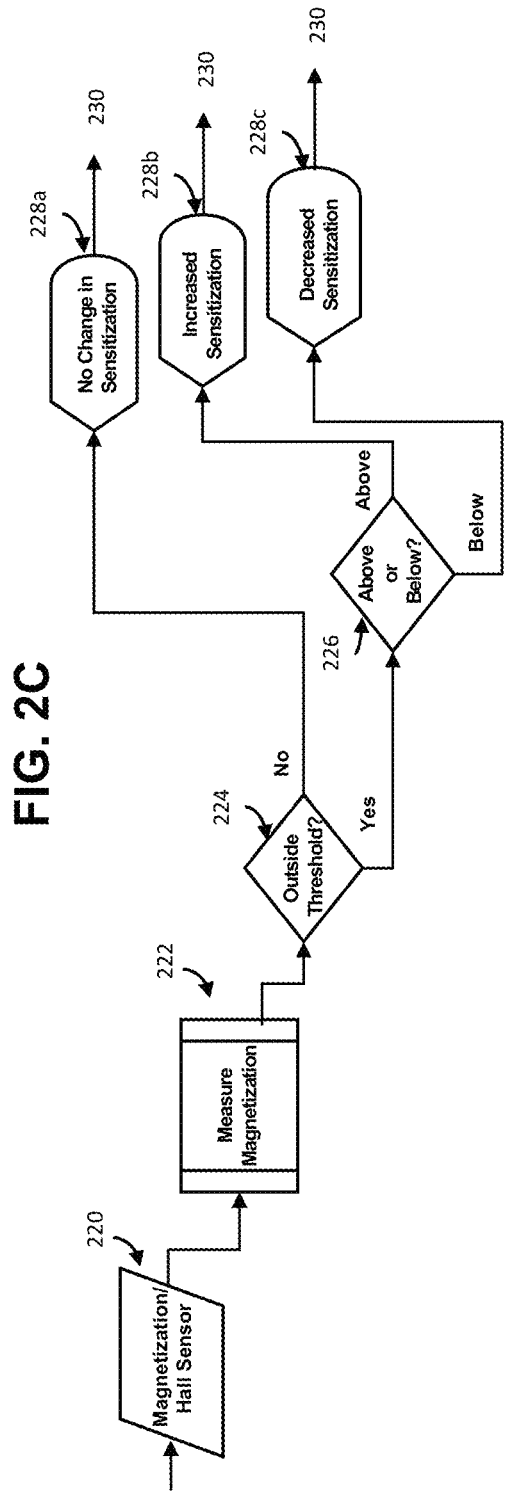

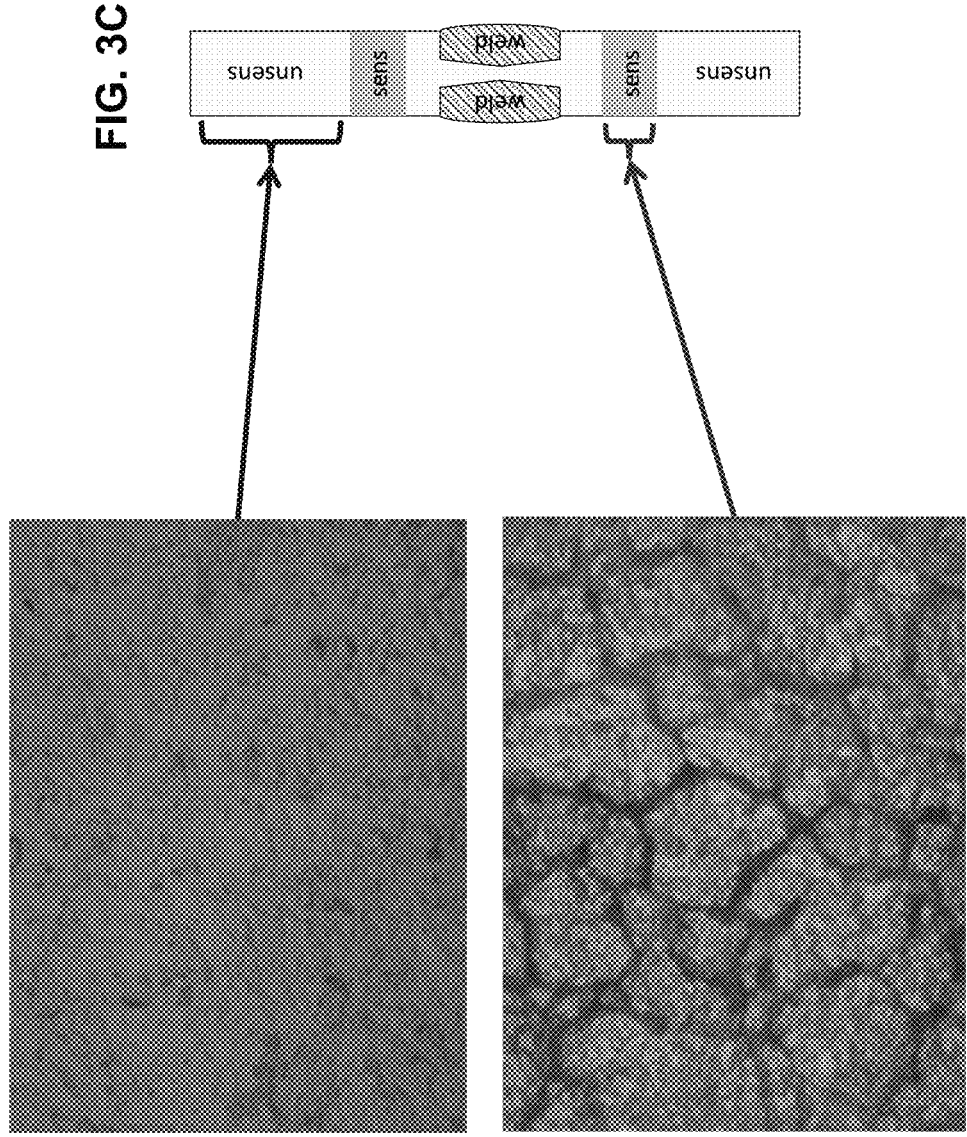

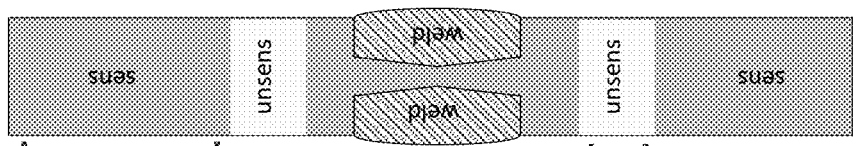
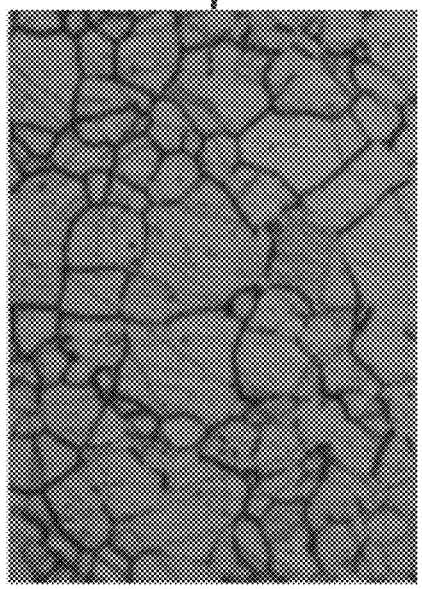
FIG. 4A
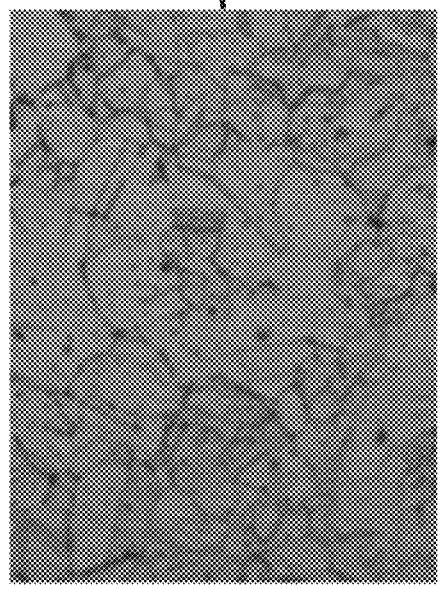
FIG. 4B
FIG. 4C

APPARATUS, SYSTEMS, AND METHODS FOR MEASUREMENT USING MAGNETO-OPTICAL KERR EFFECT

CROSS REFERENCE TO RELATED APPLICATIONS

This patent application claims priority to U.S. Provisional Application No. 63/107,830, filed on Oct. 30, 2020. The entire contents of the provisional application are incorporated herein by reference.

FIELD OF THE INVENTION

The magneto-optical Kerr effect (MOKE) is used in methods for measuring variations in magnetic permeability and magnetization to determine the presence of sensitization. MOKE-magnetometry-based apparatus and systems may be used to provide in-field magnetic measurements, and may be particularly useful in methods for assessing changes in composition, crystal structure, and grain size in magnetic materials.

BACKGROUND OF THE INVENTION

When welding stainless steel, elements can diffuse and form new phases. In the heat-affected zone (HAZ), which includes a solid solution zone where temperatures during welding can exceed 1000° C., and a carbide precipitation zone where temperatures can range from 500-800° C., new phases may form.

In some stainless steels, carbides can form at the grain boundaries in the carbide precipitation zone of the HAZ, leaving the alloy susceptible to intergranular corrosion (and "sensitive" to its environment). Similarly, steel that is already sensitized can become desensitized, if the temperatures in the HAZ are appropriate. Sensitization may be detected, for example, using techniques such as the electrochemical potentiokinetic reactivation test or optical microscopy.

Often, these carbides are chromium-based carbides (unless there are other, more stable carbide formers included in the stainless steel). By decreasing the amount of chromium in the bulk (especially near the grain boundaries), the corrosion resistance decreases along with changes in other parameters (such as electrical resistivity and magnetic permeability). These changes adversely affect the welded material.

Existing analytical tools and methods do not readily provide adequate information regarding alterations in properties of welded materials. In addition, they are destructive, and do not readily measure properties of welded materials in the field.

SUMMARY OF THE INVENTION

The invention described herein including the various aspects and/or embodiments thereof, meets the unmet needs of the art, as well as others, by using the magneto-optical Kerr effect (MOKE) to capture variations in magnetic performance, and determine the presence of sensitization based on changes in magnetic properties. A MOKE magnetometry apparatus may be used to provide in-field magnetic measurements, and may be particularly useful in methods for assessing changes in composition, crystal structure, and grain size in magnetic materials.

According to a first aspect of the invention, apparatus are provided for measuring magnetic permeability and magnetization in a magnetic alloy, which include a magneto-optical Kerr effect (MOKE) microscope provided within a metallic housing having an aperture therein; attachment means for removably attaching the metallic housing to a surface of the magnetic alloy; and a magnetic field-producing apparatus provided with arms for conducting a magnetic field to a surface of the magnetic alloy.

According to another aspect of the invention, systems are provided for determining sensitization in a magnetic alloy. The systems include a magneto-optical Kerr effect (MOKE) microscope; and a controller programmed to receive a permeability measurement for the magnetic alloy from the MOKE microscope, and compare the received permeability measurement with threshold values for magnetic permeability for the magnetic alloy. The controller is programmed to determine that if the permeability measurement is within the threshold values there is no change in sensitization of the magnetic alloy, to determine that if the permeability measurement is below the threshold values there is a decrease in the sensitization of the magnetic alloy, and to determine that if the permeability measurement is above the threshold values there is an increase in sensitization of the magnetic alloy. Upon a determination that sensitization of the magnetic alloy has increased or decreased, the controller generates maintenance recommendations for the magnetic alloy.

In additional aspects, the systems further include a Hall effect sensor, and the controller is programmed to receive a magnetization measurement for the magnetic alloy from the Hall effect sensor, and compare the received magnetization measurement with threshold values for magnetization for the magnetic alloy. The controller is programmed to determine that if the magnetization measurement is within the threshold values there is no change in sensitization of the magnetic alloy, to determine that if the magnetization measurement is below the threshold values there is a decrease in sensitization of the magnetic alloy, and to determine that if the magnetization measurement is above the threshold values there is an increase in sensitization of the magnetic alloy.

According to another aspect of the invention, methods are provided for performing MOKE magnetometry on magnetic materials in the field. The methods may be used to detect variations in magnetic permeability and magnetization in heat-treated magnetic materials. The methods include measuring the magnetic permeability and magnetization of a portion of a magnetic material not subjected to a heat treatment; measuring the magnetic permeability and magnetization of a portion of a magnetic material subjected to a heat treatment; comparing the magnetic permeability and magnetization of the portion of the magnetic material not subjected to the heat treatment with the magnetic permeability and magnetization of the portion of the magnetic material subjected to the heat treatment; and determining if the portion of the magnetic material subjected to the heat treatment has undergone a change in magnetic permeability and magnetization. An increase in magnetic permeability and magnetization in the portion of the magnetic material subjected to a heat treatment indicates that the magnetic material is sensitized.

The apparatus, systems, and methods beneficially permit quantification of changes in composition, crystal structure, and grain size of magnetic alloys, such as welded stainless steel, by measuring variations in magnetic permeability and magnetization using MOKE magnetometry.

Other features and advantages of the invention will become apparent to those skilled in the art upon examination of the following or upon learning by practice of the invention.

BRIEF DESCRIPTION OF THE DRAWINGS

FIGS. 2A-2D are flow charts for processing permeability and magnetization information obtained using the systems and apparatus of the invention, including displaying the data.

FIGS. 3A-3C depict the microstructure and macrostructure of unsensitized then welded 440C stainless steel plates. In FIG. 3A, there is no precipitation outside the heat affected zone (HAZ). In FIG. 3B, there is carbide precipitation along grain boundaries inside the HAZ. A schematic of the steel plate, weld, and sensitized and unsensitized areas is depicted in FIG. 3C.

FIGS. 4A-4C depict the microstructure and macrostructure of sensitized then welded 301 stainless steel plates. FIG. 4A shows post-weld carbide precipitation along grain boundaries in the area outside the weld zone (top arrow from micrograph). FIG. 4B shows no precipitation in the heat affected zone (bottom arrow) because it was desensitized by the temperatures seen during welding. A schematic of the steel plate, weld, and sensitized and unsensitized areas is depicted in FIG. 4C.

DETAILED DESCRIPTION OF THE INVENTION

Figure 1:
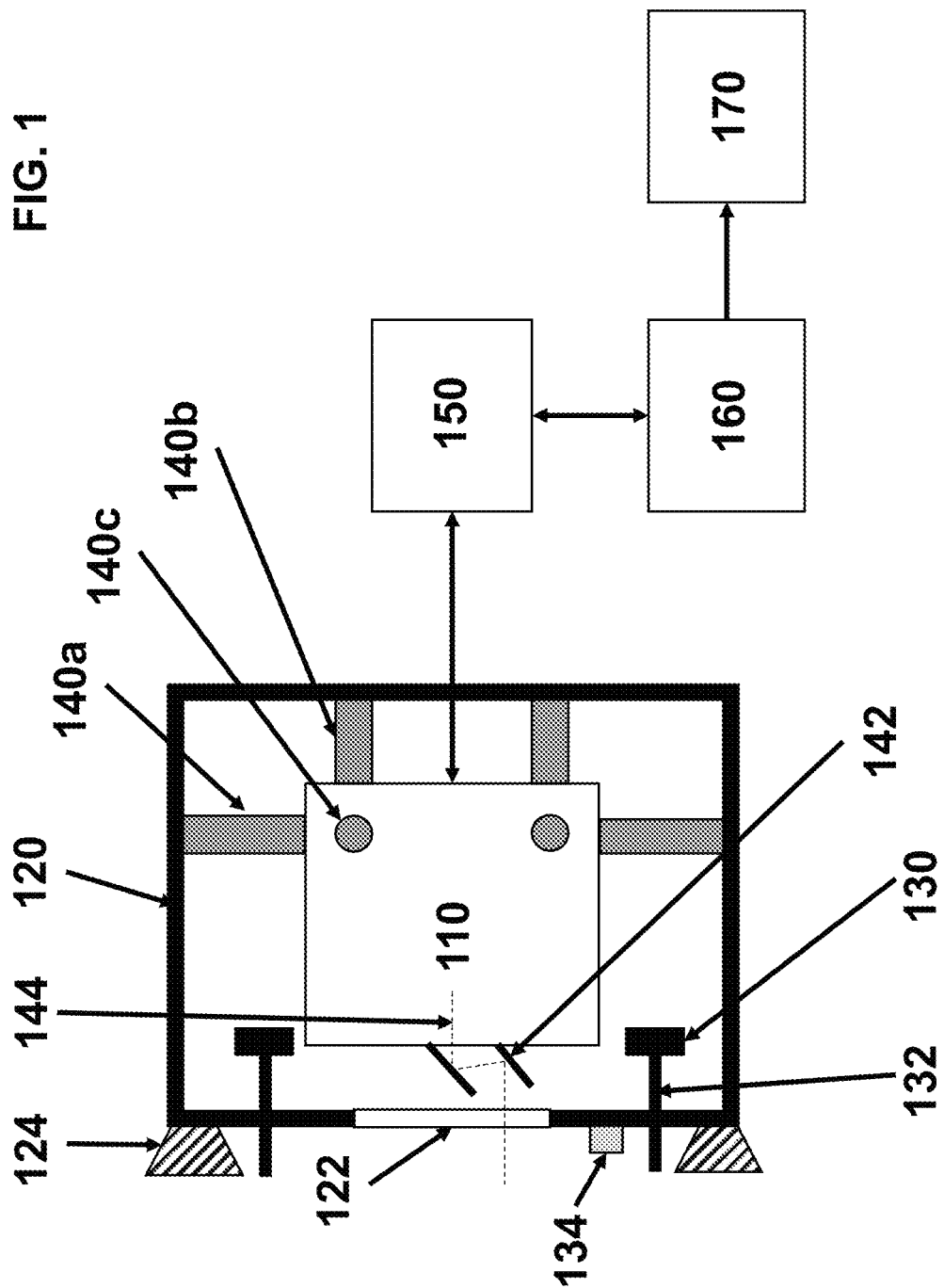
FIG. 1 depicts a diagram of a system for measuring magnetic properties in a magnetic material.

The invention provides methods for using the magneto-optical Kerr effect (MOKE) to measure variations in magnetic permeability and magnetization to determine the presence of sensitization. MOKE-magnetometry-based apparatus and systems are also provided for use in making in-field magnetic permeability and magnetization measurements.

The methods, apparatus, and systems of the invention are particularly useful for assessing changes in composition, crystal structure, and grain size in magnetic materials, particularly stainless steel that has been welded.

Additional materials that may be analyzed in accordance with the invention include, but are not limited to, austenitic steels with a martensite start temperature above room temperature, and martensitic steels with a martensite start temperature either above room temperature with a martensite finish temperature below room temperature or a martensite start temperature below room temperature. The changes in crystal structure and/or composition may be caused by exposure to high heat (e.g., greater than about 723° C., but less than the melting temperature of the material, for any amount of time). The heat exposure may be due to welding, but is not limited to heat used during welding. Other types of heat exposure that may cause the magnetic properties of a material to be altered include, for example, flame cutting, and exposure to high heat conditions within an engine.

The magneto-optical Kerr effect (MOKE) causes the orientation of polarized light to rotate after interacting with the surface of a magnetic material. The methods of the invention take advantage of this effect to measure magnetic hysteresis loops, where the applied magnetic field is being changed while the intensity of the polarization shift is being monitored. While MOKE is generally not quantitative, by calibrating this polarization shift with another technique, such as vibrating sample magnetometry (VSM), this measured shift can be made quantitative and used in measurements.

The saturation magnetization of each component (base material, heat-affected zone, and weld material) should be measured using the VSM technique. This can be accomplished by cutting a long rectangle out of the welded plate that includes the weld, HAZ and base metal. Thin square, rectangle, or disc shaped samples can be serially cut out of the material to determine the linear change in saturation magnetization as we progress through the various materials. Saturation magnetization is used, since it is not affected by the sample geometry. These values can be used to provide a scaling factor for all of the MOKE measurements for a given material and weld wire, provided an in-field measurement is made. An in-field measurement can be made in the base plate, which can provide the scaling factor for that region and surface condition, which can then provide a more quantitative measure of degree of sensitization and permeability/magnetization change (which can also be correlated to sensitization change).

Use of MOKE magnetometry to detect changes in magnetic permeability/magnetization, such as those exhibited by stainless steel as a result of welding, beneficially permits non-destructive measurement of the variations in magnetic properties in the base metal, metal in the HAZ, and in the weld. The invention encompasses evaluation of spatial property variation, which may be verified with VSM measurements. MOKE magnetometry is used in accordance with the methods of the invention to capture variations in magnetic performance between the weld, HAZ, and base plate.

The hysteresis loop features detected in accordance with the invention may include changes in permeability ("slope"), and saturation magnetization (generally qualitative). The magnetic changes exhibited in the sample as a result of sensitization include reduction in Cr content (leading to an increase in saturation magnetization and permeability, and changes in the exchange integral to become more positive), and reduction in C content (leading to a potential change from body-centered tetragonal (BCT) to body-centered cubic (BCC) lattice structure, increasing the magnetic permeability and saturation magnetization).

Apparatus.

According to additional aspects of the invention, an apparatus for measurement of variations in magnetic properties in alloys is provided.

In some aspects, apparatus are provided for measuring magnetic permeability and magnetization in a magnetic alloy, which include a magneto-optical Kerr effect (MOKE) microscope provided within a metallic housing having an aperture therein; attachment means for removably attaching the metallic housing to a surface of the magnetic alloy; and a magnetic field-producing apparatus provided with arms for conducting a magnetic field to a surface of the magnetic alloy.

As shown in FIG. 1, the apparatus may include a MOKE microscope 110, which is in communication with a memory module 150 for storing data regarding magnetic properties measured along with data regarding the sample that was measured, and the location where the magnetic properties were measured. The memory module may be an internal component of the MOKE microscope 110, or it may be provided external to it. A processor 160 that is configured with instructions or software for carrying out the methods of the invention is used to compare stored magnetic property values and sample and/or location data from the MOKE microscope, and provides output indicating if magnetic properties have changed from one sample to another, or in different locations. The output may be stored in the memory module 150. The apparatus optionally includes a display 170 in communication with the processor for providing the output regarding the magnetic properties in the measured samples/locations in visual form to a user. The display, processor, and memory may be provided together in a personal computer or handheld computing apparatus.

MOKE is normally a laboratory-scale device. To convert the MOKE microscope 110 to a field device, a metallic housing 120 with an aperture 122 permitting measurements is provided. The metallic housing is preferably non-magnetic, to minimize interactions with the measurements. In some aspects, the metallic housing may be formed from aluminum or an aluminum alloy. Metallic housing 120 can be temporarily affixed to the surface of the structure being assessed (for example, using suction cups 124, or other means for removably attaching the metallic housing and MOKE microscope to a surface being analyzed), both to stabilize the measurement and to provide a consistent working distance from the surface.

While a variable magnetic field may be applied, the apparatus may be easier to use in a field setting if it utilizes a constant magnetic field. The apparatus incorporates one or more magnetic field-producing apparatus 130. The magnetic field-producing apparatus 130 includes one or more high magnetic permeability arms 132 to conduct the magnetic field to the surface of the structure (such as iron, which has a permeability ($\mu$)=$6.3\times10^{-3}$ H/m when 99.8% pure, or electrical steel, $\mu$=$5.0\times10^{-3}$ H/m). FIG. 1 depicts a magnetic field-producing apparatus 130 for each high magnetic permeability arm 132, but it is also within the scope of the apparatus of the invention to provide a single magnetic field-producing apparatus 130 that includes two or more high permeability arms 132. In that configuration, the single magnetic field-producing apparatus 130 and multiple high permeability arms 132 form a system in which the permanent magnet or solenoid producing the magnetic field connects the arms.

Regardless of the configuration of the magnetic field-producing apparatus 130 and high permeability arms 132, the arms 132 are in contact with the surface of the magnetic material being analyzed, or in close proximity thereto, to provide a constant field during measurement. While the device will not measure hysteresis loops under constant field, the change in permeability will yield various magnetization values in the regions of interest.

The magnetic field generated by the magnetic field producing apparatus 130 may be applied using a permanent magnet in line with the high permeability arms 132, or a solenoid coil wrapped around a section of the high permeability material arms 132, with an on board battery to provide a voltage to the coil.

If a coil is used, various magnetic fields may be applied to obtain a permeability measurement (by sweeping the field in an Alternating Current, AC, fashion). A Hall effect sensor 134 may be used to determine values of field near the measurement area of interest, and within the coil. These magnetic field values can be actively controlled, or they may be used while controlling the voltage itself, and not the field.

The metallic housing 120 for the MOKE magnetometry apparatus 110 may include apparatus for adjusting the position of the MOKE magnetometry apparatus 110 within the metallic housing 120. In some aspects of the invention, the positioning means includes micrometer measurement cylinders 140a, 140b, 140c to move the device in the x, y and z positions, respectively, both for optimal positioning on the surface being analyzed, and to move the laser between areas of interest. Adjustment of the position of the MOKE magnetometry apparatus 110 may beneficially permit more measurements to be taken through aperture 122 without having to release the apparatus from the surface to which the suction cups 124 are attached.

An additional optional automated method of adjusting the laser position may also be employed, in accordance with the apparatus of the invention. For example, adjustable mirrors 142 may be used to direct the laser beam 144 to various areas of the surface being analyzed. In some aspects of the invention, the laser position may be adjusted by providing information to the processor 150 regarding the desired adjustments, where the processor 150 is further configured by software providing instructions for adjusting the position of the laser in response to input from the user, output from the MOKE magnetometry apparatus 110, or both.

Systems.

Systems for measuring variations in magnetic properties in alloys are also provided in accordance with the invention. The systems include a MOKE microscope (which may optionally be incorporated into the MOKE magnetometry apparatus of the invention, described above), and a processor configured to receive data either directly from the MOKE microscope or from a data storage module. The processor may also receive data provided by a user through a user interface.

The systems may be used, for example, to determine the presence of sensitization in a magnetic alloy. The systems include a magneto-optical Kerr effect (MOKE) microscope; and a controller programmed to receive a permeability measurement for the magnetic alloy from the MOKE microscope, and compare the received permeability measurement with threshold values for magnetic permeability for the magnetic alloy. The controller is programmed to determine that if the permeability measurement is within the threshold values there is no change in sensitization of the magnetic alloy, to determine that if the permeability measurement is below the threshold values there is a decrease in the sensitization of the magnetic alloy, and to determine that if the permeability measurement is above the threshold values there is an increase in sensitization of the magnetic alloy. Upon a determination that sensitization of the magnetic alloy has increased or decreased, the controller generates maintenance recommendations for the magnetic alloy.

In additional aspects, the systems further include a Hall effect sensor, and the controller is programmed to receive a magnetization measurement for the magnetic alloy from the Hall effect sensor, and compare the received magnetization measurement with threshold values for magnetization for the magnetic alloy. The controller is programmed to determine that if the magnetization measurement is within the threshold values there is no change in sensitization of the magnetic alloy, to determine that if the magnetization measurement is below the threshold values there is a decrease in sensitization of the magnetic alloy, and to determine that if the magnetization measurement is above the threshold values there is an increase in sensitization of the magnetic alloy.

The systems of the invention are described in more detail with respect to the flow charts shown in FIGS. 2A-2D, which depict one exemplary embodiment of the steps that may be used to implement the methods of the invention.

The flow charts illustrate elements that may be incorporated into software that is implemented by processors incorporated into the apparatus of the invention. The processor implements the instructions, which may be in the form of software stored in a memory module or removable storage media. The processor is configured to compare permeability and magnetization data from the sample being tested with reference values of materials having known compositions, or reference values based on data obtained from one or more other locations on the same sample. Based on this comparison, the identity of the material forming the sample may be identified, and the condition of the material (such as its susceptibility to degradation or failure due to sensitization) may be determined. Based on the condition determination, maintenance and replacement recommendations may be displayed for the user on a user interface.

The processor carries out instructions to establish threshold values for magnetic permeability/magnetization based on the alloy being assessed. The thresholding of the measured magnetic permeability/magnetization values may be used in order to determine if a material area is sensitized or not sensitized. The processor may have provided thresholding that is chosen by a user, for example, by selecting from a drop down menu of alloys for testing. The thresholds may be based on standard data for known alloys when used for quantitative analysis. However, it is not necessary to identify the specific alloy in order to carry out the methods and systems of the invention. Comparison between values may be used to determine sensitized areas from non-sensitized areas even where the composition of the alloy is not known. In other aspects of the invention, the thresholds may be based on prior measurements of the sample taken at different locations, for a qualitative analysis conducted.

The processor obtains permeability/magnetization data from MOKE magnetometry measurements of different samples of the same alloy (i.e., comparing a sample of 309 stainless steel to other samples of 309 stainless steel), or from MOKE magnetometry measurements taken at different locations on a single article formed from an alloy.

The processor is programmed to compare the permeability/magnetization data from different samples or different locations on a single article in order to determine if the samples or locations exhibit a difference in magnetic permeability/magnetization that indicates a change in sensitization. The determination of changes in sensitization may be based on measurement of permeability/magnetization that is outside the established threshold values selected by a user. If no threshold values for magnetic permeability/magnetization were established, the determination regarding changes in sensitization may be based on the magnitude of the difference in magnetic permeability/magnetization measured at different locations, where the permeability/magnetization is higher in sensitized areas than in non-sensitized areas.

This information regarding differences in magnetic permeability/magnetization may be compared with additional stored data supplied by a user. The user may provide information regarding treatments applied to different samples or locations within an article being tested. Where provided, this information may be used to identify that the magnetic permeability/magnetization has changed, for example, in samples of alloys or locations within an article that were subjected to a heat treatment, such as welding or flame cutting, or were exposed to a high-heat environment (such as within an engine).

In some aspects of the invention, the processor is provided as a part or component of the MOKE microscope. In other aspects, the processor may be incorporated into a separate user interface located proximate to the MOKE microscope, such as a computer or handheld computing device. In still further aspects, the processor may be in communication with the MOKE microscope, but located remotely.

Regardless of its location, the processor may implement programming that is provided by software. The software may be stored in on-board memory, or provided on a removable data storage module that is accessed by the processor. This separate, removable data storage may also be used to store data relating to the properties of the sample or area of alloy material being tested, and may store customized information provided by a user regarding heat exposure or treatments (such as welding or flame cutting) that were conducted on the sample or alloy being tested.

The systems, methods, and software of the invention are described in more detail with respect to the flowcharts shown in FIGS. 2A-2D, which depict an exemplary embodiment of the steps that may be used to implement the methods of the invention.

Figure 2A:
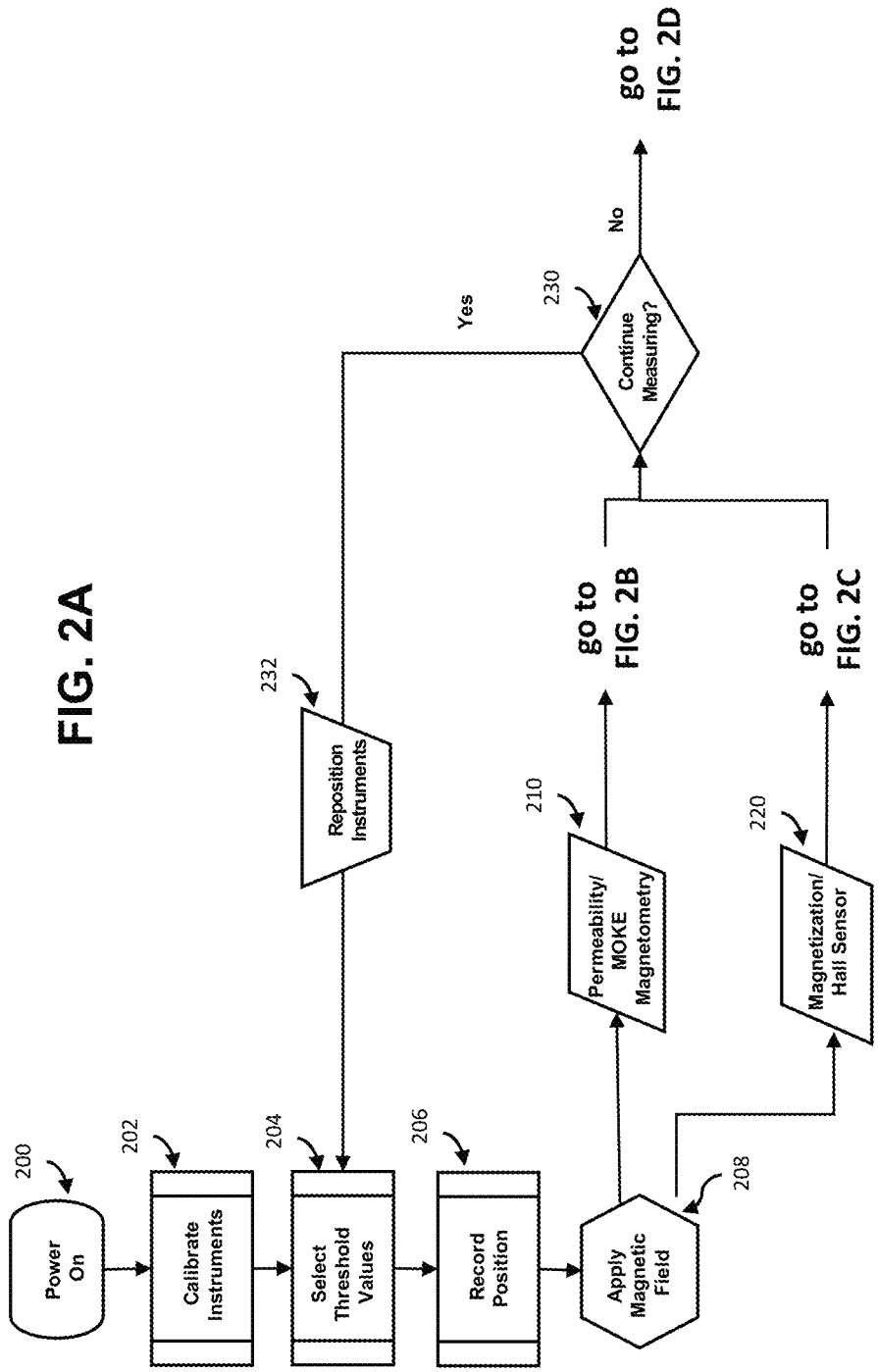

As shown in FIG. 2A, when ready for use, the apparatus is powered on 200, and optionally calibrated 202 (e.g., when self-calibrating instruments are not used). The user may also optionally select threshold values for magnetization and permeability, or a range of values for each measurement, for the sample to be analyzed in step 204. If no values are selected by the user, then the apparatus may compare values obtained by measuring in one area of the sample against values obtained by measuring in a different area of the sample.

The position at which the measurement is to be taken is recorded 206, and the magnetic field is applied to the sample 208, for example, using the magnetic field-producing apparatus 130 includes one or more high magnetic permeability arms 132.

The magnetic permeability measurement 210 is performed in accordance with the flow chart in FIG. 2B. As shown in FIG. 2B, the permeability measurement is taken by MOKE magnetometry using MOKE microscope 110. Once magnetic permeability is measured 212, in step 214 the value obtained by the measurement is compared with the threshold values selected in 204. If the value is not outside the threshold range, then there is no change in sensitization in the sample being measured 218a. If the value is outside the threshold range, then a further determination of whether the value is above or below the range is made. If above the threshold value range, the sample exhibits increased sensitization 218b. If below the threshold value range, the sample exhibits decreased sensitization 218c.

The magnetization measurement 220 may also be performed in accordance with the flow chart in FIG. 2C. As shown in FIG. 2C, magnetization measurement is taken using a Hall sensor 134. Once magnetization is measured 222, in step 224 the value obtained by the measurement is compared with the threshold values selected in 204. If the value is not outside the threshold range, then there is no change in sensitization in the sample being measured 228a. If the value is outside the threshold range, then a further determination of whether the value is above or below the range is made. If above the threshold value range, the sample exhibits increased sensitization 228b. If below the threshold value range, the sample exhibits decreased sensitization 228c.

Once the measurements 210 and 220 have been taken, the processor determines whether additional measurements are to be taken 230. The determination may be made based on input in response to a prompt displayed on the user interface, or may be based on a pre-programmed pattern of measurements (e.g., a grid).

If additional measurements are to be taken, the apparatus may optionally be repositioned before taking the next measurement, whether manually by removing the apparatus from the surface of the sample being tested and repositioning it in a new location. Alternatively, the apparatus may not be moved, but the adjustable mirrors 142 may be used to direct the laser beam 144 to a different area of the surface being analyzed.

Once the instrument or laser beam has been repositioned for the next measurement, an optional step of selecting threshold values 204 may be used to allow comparison of measurements from one location on the sample to measurements obtained at a different location on the sample. If the sample is formed using more than one material, a stored set of threshold values may be selected that corresponds to the material to be measured next. The new position where the measurement is to be taken may be recorded 206, and the magnetic field may be reapplied 208.

Figure 2D:
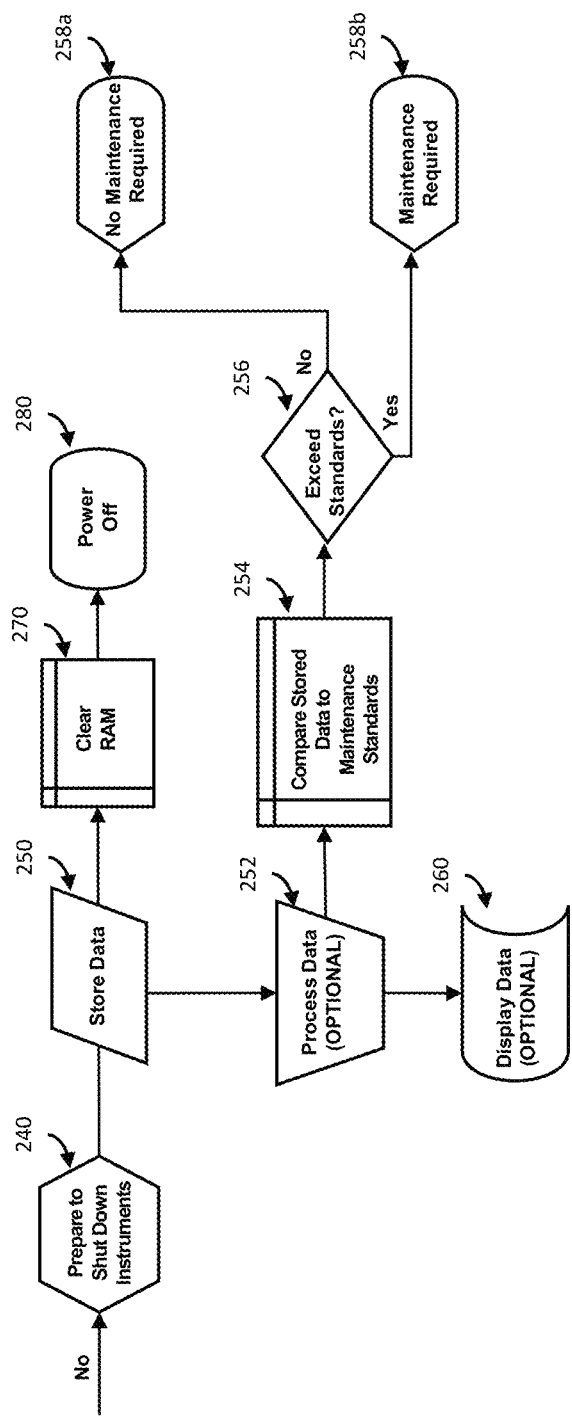

If no further measurements of magnetic permeability and/or magnetization are needed, the system proceeds to shut down, as shown in FIG. 2D.

In FIG. 2D, the system prepares to shut down 240 by storing any measurement and position data obtained by the apparatus of the invention in memory or on a data storage apparatus for use in later analysis. The RAM of the apparatus may be cleared 270, and the apparatus may be powered off 280.

The systems of the invention may optionally be used to conduct processing 252 of the data obtained from the measurements of magnetic permeability and magnetization. The processing may include, but is not limited to, comparison 254 of the stored data against standards for the material being assessed. This comparison 254 may be made with respect to maintenance standards for the material. The processor may then implement a step of comparing 256 the measured values for magnetic permeability and magnetization with standard values associated with required maintenance or replacement of the material. Multiple different standards for multiple different magnetic alloys may be stored in the memory of the systems of the invention. These may include, but are not limited to, acceptable levels of corrosion and sensitization for the material and associated measurements of magnetic permeability and magnetization; levels of corrosion and sensitization for the material that require repair and the associated measurements of magnetic permeability and magnetization; and levels of corrosion and sensitization for the material that require replacement and the associated measurements of magnetic permeability and magnetization.

If the measured values do not exceed the range of the standard values for acceptable levels of corrosion and sensitization stored in memory, then no maintenance of the material is required 258a. If the measured values exceed the standard values, then the material being measured has suffered damage due to heat treatment and/or heat exposure that requires maintenance 258b, 258c. If the measured values exceed the standard values by greater than about 50%, preferably greater than about 25%, then the material being measured has suffered significant damage due to heat treatment and/or heat exposure and the material should be replaced.

The systems and methods of the invention also encompass steps for providing to a user maintenance recommendations and material failure thresholds associated with the material being analyzed, including alerts or warnings when applicable material failure thresholds are exceeded.

The processors used in the systems of the invention collect data regarding magnetic properties and sensitization of the alloy being tested, and process the data into usable information. The data may be presented as raw values, or may optionally be subjected to further processing by comparing the values to standard values, such as standards regarding maintenance and replacement alerts.

The maintenance alerts may take a variety of forms, including, but not limited to, alerts indicating that a tested portion of the alloy exhibits sensitization that is approaching a level of concern (such as a risk of weld failure). The alerts may be generated by comparing values relating to magnetic properties with maintenance and replacement data for that alloy, as stored in on-board memory or removable data storage.

The processor may transmit the information to a user interface to be displayed for a user. The user interface preferably provides a visual indication of the status of the sections of the alloy being analyzed. The user interface displays information-based instructions, warnings, and/or alerts transmitted by the processor, which are based on the comparison magnetic property data with maintenance recommendations and/or material failure thresholds. The user interface may be designed with features for receiving user input in response to the sensor data, and transmitting that user input back to the processor.

The software instructions used to configure the systems of the invention may be stored in a memory module and executed remotely by a processor in a computer that is in communication with the apparatus used in the systems and methods of the invention. The software may also be stored in a computer-readable memory provided onboard the apparatus of the invention, preferably in the integrated circuit card (ICC), and executed locally by a processor provided in the apparatus. Those skilled in the art will recognize that the methods of the invention may be implemented using various computer systems and/or architectures, and the methods of the invention are not limited to any particular configuration.

The flow charts illustrate elements that may be incorporated into software that is implemented by processors incorporated into the apparatus of the invention. Processors may be provided on one or both of the MOKE microscope and user interface of the apparatus of the invention, as well as in separate computers, and are configured to compare Kerr amplitude data (functionality measuring magnetization) from the MOKE microscope as taken from two or more locations on the alloy being tested.

References to processors herein may include processors or microprocessors that are incorporated into controllers or microcontrollers. These controllers or microcontrollers may incorporate the processor or microprocessor along with additional components such as RAM, ROM, and programming that renders the microcontroller or controller a special-purpose machine customized for use in the systems of the invention and for carrying out the methods of the invention.

Methods.

According to some aspects of the invention, methods for measuring variations in magnetic properties of alloys are provided. The variations may be a result of a heat treatment applied to the alloy, such as welding, or as a result of exposure to high levels of ambient heat in the environment surrounding the alloy, such as alloys used in an engine compartment.

The methods of the invention may beneficially be used to perform MOKE magnetometry directly on magnetic materials in the field, rather than requiring samples to be removed and analyzed in a laboratory.

The methods include measuring variations in magnetic performance (such as magnetic permeability and magnetization) in a sample of an alloy not subjected to heat exposure, and measuring the magnetic performance of an alloy subjected to heat exposure. The measurements may be taken from multiple different locations on the alloy subjected to a heat treatment that is being tested. The measurements may be obtained, for example, using MOKE magnetometry.

The methods may be used to detect variations in magnetic permeability and magnetization in heat-treated magnetic materials. The methods include measuring the magnetic permeability and magnetization of a portion of a magnetic material not subjected to a heat treatment; measuring the magnetic permeability and magnetization of a portion of a magnetic material subjected to a heat treatment; comparing the magnetic permeability and magnetization of the portion of the magnetic material not subjected to the heat treatment with the magnetic permeability and magnetization of the portion of the magnetic material subjected to the heat treatment, and determining if the portion of the magnetic material subjected to the heat treatment has undergone a change in magnetic permeability and magnetization. An increase in magnetic permeability and magnetization in the portion of the magnetic material subjected to a heat treatment indicates that the magnetic material is sensitized.

If the entire alloy was subjected to heat treatment, the measurements may be compared to determine if any portions of the alloy are at greater risk of structural failure as a result of the heat exposure.

The methods of the invention further encompass methods for detecting changes in sensitization around a welded area. Welding is a heat treatment that may be conducted in a targeted area of an alloy, and may lead to structural problems in the heat affected zone (HAZ) surrounding the weld. These methods may be used with any type of magnetic alloy, but are particularly useful when performed on welded stainless steel (due to the change from a paramagnetic material to a ferromagnetic material).

The methods include determining sensitization of a portion of the alloy not within a heat affected zone from a welding operation, and measuring sensitization of a portion of the alloy within the HAZ from a welding operation. The assessment of sensitization may be made at multiple different locations on the alloy being tested, but in some embodiments, the measurements are taken within the HAZ, outside the HAZ, in the weld material only, and across the weld/HAZ border. The determination of sensitization may be made using a combination of induction infrared thermography (IIRT) and MOKE magnetometry.

The measurements of sensitization in the different areas of the alloy may be compared to determine if a portion of the alloy within the heat affected zone has undergone a change in sensitization. This can be just a binary (yes/no) determination of sensitization. This determination, however, may also be calibrated using a separate magnetometer to provide a quantitative measure of the degree of sensitization. This would be most conveniently represented as a percentage of sensitization. If the material is determined to be sensitized, the material can be replaced, or repaired with a local thermal treatment.

The measurement used to calibrate the degree of sensitization utilizes some external magnetometer (such as a vibrating sample magnetometer, VSM) to measure the magnetization in the base metal, HAZ, and weld metal. By knowing the limits of magnetization in these extremes, a scaling factor can be applied to the MOKE magnetization data using the calibrated information from the magnetometer. It may be necessary to fabricate a separate, fully sensitized material to determine the full extent of sensitization possible and determine a percentage of sensitization. Samples can be separately heat treated and measured, or measured in situ in the magnetometer, if it is provided with a thermal chamber attachment.

While IIRT is sometimes used to measure degree of sensitization, its accuracy is limited by a lack of magnetic information available to fully model the system. MOKE can be used to provide the necessary magnetization and permeability information to correct the theoretical models to improve IIRT and analysis of the experimental data.

The measurements obtained in accordance with the methods of the invention may be carried out using any MOKE magnetometry apparatus. A presently preferred apparatus is the NanoMOKE3® magnetooptical magnetometer and Kerr microscope (Durham Magneto Optics Ltd., Caxton, Cambridgeshire, England, UK).

Similar techniques may also be used to measure magnetic properties using an array of Hall effect sensors, based on what is measurable using MOKE.

The methods include measuring variations in magnetic performance in magnetic materials subjected to a heat treatment, where the variations in magnetic performance are measured using MOKE magnetometry, and optionally magnetic field data is obtained using Hall effect sensors. The methods include measuring magnetic performance in an alloy inside an area suspected of being a heat-affected zone (HAZ) and outside the area suspected of being a HAZ. In some aspects, the magnetic performance inside the suspected HAZ is compared with the magnetic performance outside the suspected HAZ to determine a change in sensitization of the alloy following the heat treatment.

The methods also include determining a change in sensitization in a magnetic material based on measured changes in magnetic properties. The methods include measuring magnetic properties in a magnetic material before exposure to a sensitizing temperature using MOKE magnetometry, measuring magnetic properties in the magnetic material after exposure to the sensitizing temperature using MOKE magnetometry, and comparing the magnetic properties before and after exposure to the sensitizing temperature to determine a change in sensitization of the magnetic material following exposure to the sensitizing temperature.

This may be accomplished, for example, by taking measurements in a region affected by a heat treatment, and in a region not affected by a heat treatment, and comparing the measurements in each region to determine if the heat treatment compromised the structure of the alloy. In some aspects of the invention, the measurements may beneficially provide information regarding sensitization of the alloy before intergranular corrosion compromises its structural integrity. The regions of the alloy that have become sensitized may be treated to prevent or minimize corrosion.

If the entire alloy was subjected to a heat treatment, measurements of a sample of the same alloy that was not subjected to the heat treatment may be compared with measurements of one or more locations on the alloy subjected to heat treatment to determine if any portions of the alloy are at greater risk of structural failure as a result of the heat exposure.

The methods of the invention further encompass methods for detecting changes in sensitization around a welded area. Welding is a heat treatment that may be conducted in a targeted area of an alloy, and may lead to structural problems in the heat affected zone (HAZ) surrounding the weld. These methods may be used with any type of magnetic alloy, but are particularly useful when performed on welded stainless steel.

The methods include determining sensitization of a portion of the alloy not within a heat affected zone from a welding operation, and determining sensitization of a portion of the alloy within the HAZ from a welding operation. The assessment of sensitization may be made at multiple different locations on the alloy being tested, but in some embodiments, the measurements are taken within the HAZ, outside the HAZ, in the weld material only, and across the weld/HAZ border. In some aspects of the invention, the determination of sensitization may be made using a combination of magnetic field magnitude determination using Hall effect sensors and magnetic permeability and magnetization using MOKE magnetometry.

The methods of the invention are based on the discovery that sensitized magnetic materials exhibit changes in magnetic properties and performance, such as magnetic permeability and magnetization. By detecting these changes, sensitization can be determined in the magnetic material before corrosion compromises the integrity of the item or part formed from the magnetic material.

The methods of the invention may be employed, for example, to test welded materials before they are placed in service.

The methods of the invention may also be used to test parts included in a machine room or engine as part of a routine maintenance procedure, such that the parts can be identified as needing replacement before a critical failure occurs. This aspect of the invention may beneficially reduce maintenance costs by preventing larger failures, or if testing shows that sensitization of the part has not occurred, by allowing the part to remain in use.

EXAMPLES

The methods of the invention will now be demonstrated by way of the following non-limiting examples.

Example 1

Initially, measurement of the sensitization level in welded stainless steel samples was conducted using induced infrared thermography (IIRT). The electrical resistivity was thought to be orders of magnitude different. However, when measured, the resistivity in sensitized and parent areas was very close (difference of about a factor of 2) and did not support the required change in electrical resistivity needed for robust detection systems and methods.

Further modeling demonstrated that the induced infrared response was describable by both changes in electrical resistivity and magnetic permeability. Because experiments did not support the required change in electrical resistivity, it was determined that magnetic permeability changes play a dominant role in the induced infrared response. (M. Roberts, et al., "Induction Infrared Thermography for Non-destructive Evaluation of Welding-Induced Sensitization in Stainless Steels", *Journal of Nondestructive Evaluation*, Vol. 40, No. 1 (2021)).

Example 2

As described in Table 1, below, the effect of welding on the base material can vary. The base plate material is ⅛" thick, and the weld filler material used for each sample was 309 stainless steel. All samples were cut with a waterjet, to avoid any potential thermal effects that might be introduced by sample cutting. After cutting, the MOKE samples were mounted and polished to 600 grit surface finish.

TABLE 1

| Base Plate | HAZ | Expected Permeability change |
| --- | --- | --- |
| Sensitized 301 SS | De-sensitized | Higher in baseplate |
| 316 SS | Not sensitized | No change |
| 440C SS | Sensitized | Higher in HAZ |

The three welded samples exhibited different responses to welding. The 301 steel with a 309 steel weld was sensitized in the bulk plate but not sensitized in the HAZ. The 316 steel with a 309 steel weld was not sensitized anywhere. The 440C steel with 309 steel weld was not sensitized in the bulk plate, but was sensitized in the HAZ, and likely had a very high magnetic permeability in the HAZ.

Samples were measured using the NanoMOKE3® magnetooptical magnetometer and Kerr microscope (Durham Magneto Optics Ltd., Caxton, Cambridgeshire, England, UK), and the sample position was changed using mounted micrometers. Hysteresis loops were measured as a function of position (x and/or y), where the sample long-axis was mounted perpendicular to field direction.

By moving a sample through the laser beam, hysteresis loops can be measured along the length of the sample. Features of the hysteresis loop can change, corresponding to changes in composition, crystal structure, grain size, etc. In welded steel samples, a distinct change in permeability was observed when moving from the base metal, through the heat affected zone (HAZ), and into the weld. This measured change in permeability affects similar methods of characterizing samples, such as Induction Infrared Thermography (IIRT), which has been used to measure changes in sensitization in steel (M. Roberts, et al., "Induction Infrared Thermography for Non-destructive Evaluation of Welding-Induced Sensitization in Stainless Steels", *Journal of Nondestructive Evaluation*, Vol. 40, No. 1 (2021)).

Simulated results (and experimental measurements of electrical resistivity in samples) indicated that unexpected changes of magnetic permeability in the HAZ may have a large effect on the measured heat signature from IIRT (M. Roberts, et al., "Induction Infrared Thermography for Non-destructive Evaluation of Welding-Induced Sensitization in Stainless Steels", *Journal of Nondestructive Evaluation*, Vol. 40, No. 1 (2021)). By measuring the change in permeability in a non-destructive fashion, otherwise unknown data can be provided to the IIRT models, also minimizing the amount of time it takes to slice and measure tiny samples to get site-specific magnetic information.

FIGS. 3A-3B show an originally unsensitized 440C steel plate (width=0.125 inches), which became sensitized in the HAZ. The area outside the HAZ shows no precipitation (FIG. 3A), while the area inside the HAZ shows carbide precipitation along grain boundaries (FIG. 3B). A schematic of the macrostructures in the samples is shown in FIG. 3C.

FIGS. 4A-4B show an originally sensitized 301 steel plate (width=0.125 inches), where welding desensitized the plate in the HAZ. The sensitized area of the base plate shows carbide precipitation along grain boundaries (FIG. 4A). There is no precipitation in the weld zone, which was desensitized by welding (FIG. 4B). A schematic of the macrostructures in the samples is shown in FIG. 4C.

Figure 5:
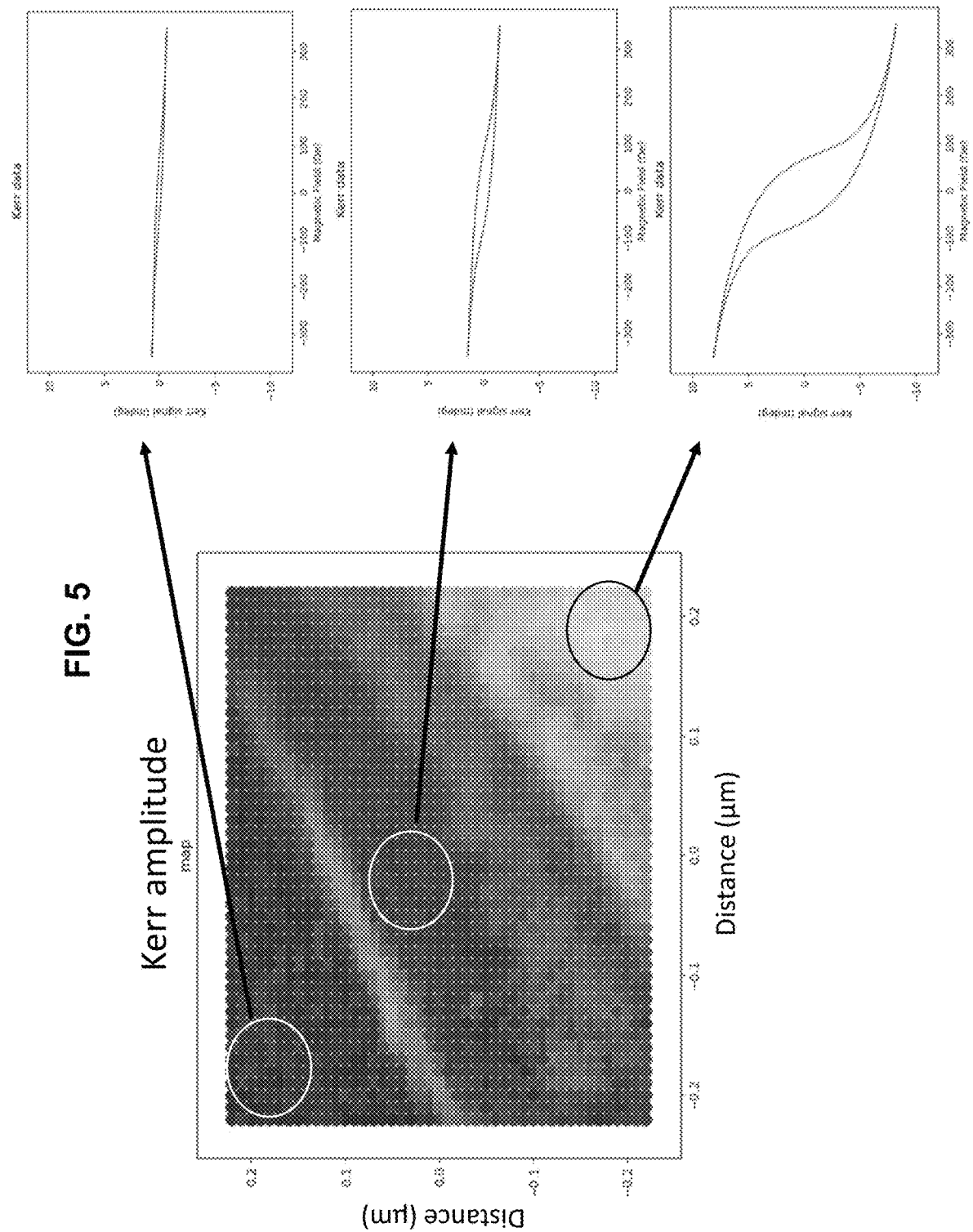
FIG. 5 shows measurement of the Kerr amplitude of a 301 steel sample, sensitized in the bulk with varying applied magnetic fields. The measurement was made in various locations, exiting the weld.
Figure 6B:
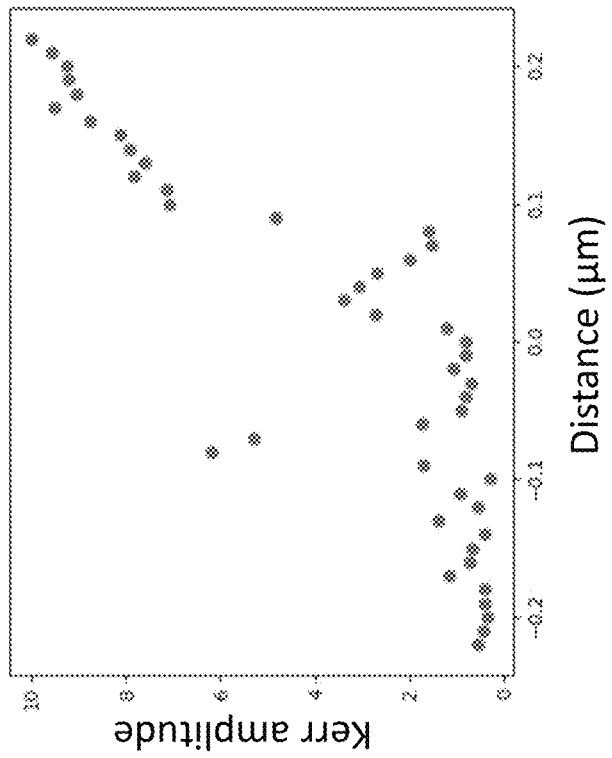
FIG. 6B is a graphical depiction of the linear trace of FIG. 6A.
Figure 6A:
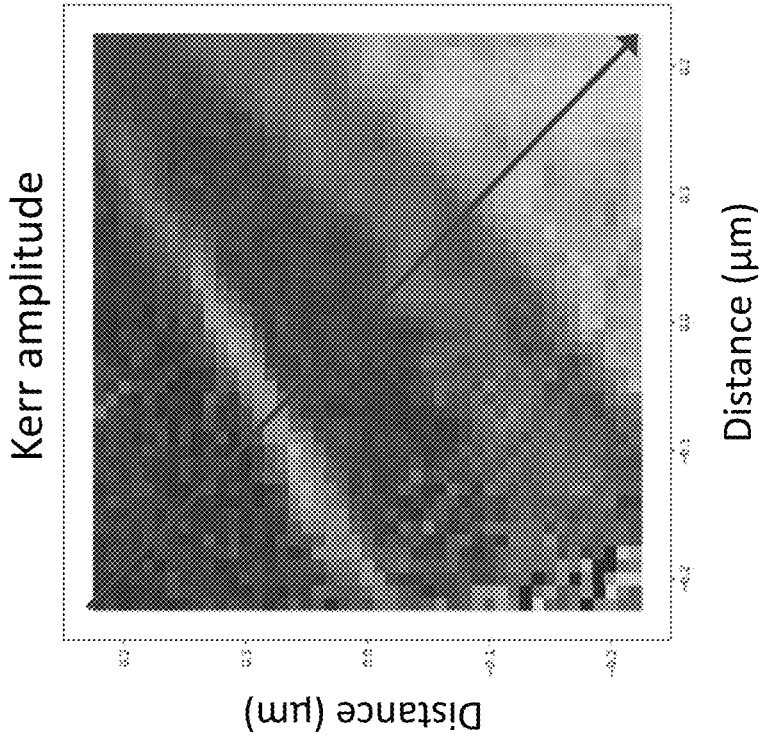
FIG. 6A shows a linear trace of Kerr amplitude of a 301 steel sample, sensitized in the bulk, exiting the weld, at a constant applied field.

FIGS. 5 and 6A-6B show MOKE magnetometry measurements of welded 301 stainless steel that was sensitized in bulk. Measurements were taken across the weld.

In FIG. 5, the circles show the location of measurements, which were all within the taken from across the weld, into the bulk in the HAZ. The sample shows minimal magnetic signal (as shown by the Kerr Amplitude) and a low permeability (slope of the Kerr Amplitude) in the welded section, signifying more paramagnetic behavior. The bulk region shows a much more defined magnetic hysteresis loop with a larger Kerr amplitude and increased magnetic permeability around zero field.

Figure 7:
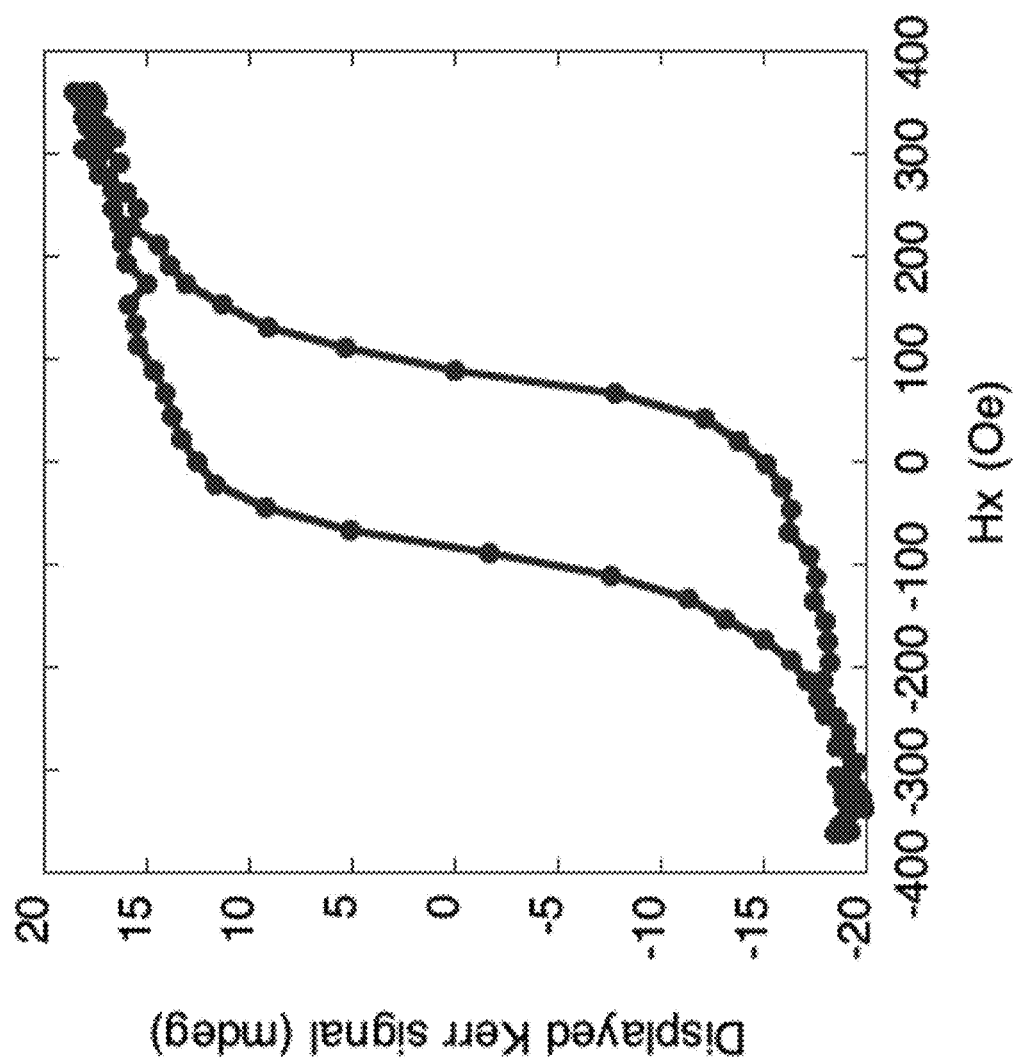
FIG. 7 is a graph depicting the application of MOKE without polishing the steel sample. The data was obtained using 10 seconds accumulation, with 10 μm spot size.

FIG. 6A is a linear trace of Kerr amplitude in a 301 steel sample, sensitized in the bulk, exiting the welded region, at a constant applied field. A change in material behavior is clearly shown upon exiting the welded region. Magnetic permeability can be used to measure both the magnetization magnitude (Kerr Amplitude) and permeability (slope of Kerr Amplitude). FIG. 6B is a graphical depiction of the linear trace of FIG. 6A Applications using MOKE without polishing the steel are also envisioned. For application on field-deployed steel structures, magnetic performance can be measured in an unpolished steel sample using MOKE magnetometry. This is shown in FIG. 7. The data was obtained using accumulation over 10 seconds, with a 10 μm spot size. While polishing the surface of the sample may provide better reflectivity and signal-to-noise ratio (SNR), it is possible to measure the magnetic changes in an unpolished sample. After using MOKE magnetometry, small slices of the welded metal may be cut to verify the values measured using the MOKE systems, apparatus, and methods, and these may be used in methods for calibrating the measurement values obtained. To quantitatively use this data, destructive analysis may be performed, for example, using optical microscopy with an etchant for revealing sensitization in the form of carbides lining grain boundaries.

It will, of course, be appreciated that the above description has been given by way of example only and that modifications in detail may be made within the scope of the present invention.

Throughout this application, various patents and publications have been cited. The disclosures of these patents and publications in their entireties are hereby incorporated by reference into this application, in order to more fully describe the state of the art to which this invention pertains.

The invention is capable of modification, alteration, and equivalents in form and function, as will occur to those ordinarily skilled in the pertinent arts having the benefit of this disclosure. While the present invention has been described with respect to what are presently considered the preferred embodiments, the invention is not so limited. To the contrary, the invention is intended to cover various modifications and equivalent arrangements included within the spirit and scope of the description provided above.

What is claimed:

1. Apparatus for measuring magnetic permeability and magnetization in a magnetic alloy, comprising:
   a magneto-optical Kerr effect (MOKE) microscope provided within a metallic housing having an aperture therein;
   attachment means for removably attaching the metallic housing to a surface of the magnetic alloy; and
   a magnetic field-producing apparatus provided with arms for conducting the magnetic field to a surface of the magnetic alloy.

2. The apparatus of claim 1, where the arms are formed from a high permeability material selected from the group consisting of iron and electrical steel.

3. The apparatus of claim 1, where the magnetic field-producing apparatus uses a permanent magnet to produce the magnetic field.

4. The apparatus of claim 1, where the magnetic field-producing apparatus uses a solenoid coil to produce the magnetic field.

5. The apparatus of claim 1, further comprising a Hall effect sensor.

6. The apparatus of claim 1, further comprising adjustable mirrors for directing a laser beam emitted by the MOKE microscope.

7. The apparatus of claim 1, further comprising positioning apparatus for moving the MOKE microscope within the metallic housing.

* * * * *